United States Patent
Ouchi et al.

(10) Patent No.: US 6,222,868 B1
(45) Date of Patent: Apr. 24, 2001

(54) SURFACE-TYPE OPTICAL DEVICE, FABRICATION METHOD THEREFOR AND DISPLAY DEVICE

(75) Inventors: Toshihiko Ouchi; Yukio Furukawa, both of Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/154,206

(22) Filed: Sep. 16, 1998

(30) Foreign Application Priority Data

Sep. 30, 1997 (JP) .................................................. 9-282548
Sep. 7, 1998 (JP) ................................................. 10-268950

(51) Int. Cl.$^7$ .............................. H01S 5/00; H01S 3/097; H01S 3/08
(52) U.S. Cl. .................................... 372/50; 45/46; 45/88; 45/96
(58) Field of Search ................................. 372/45, 46, 50, 372/88, 96; 257/94; 438/42

(56) References Cited

U.S. PATENT DOCUMENTS

| 5,453,405 | 9/1995 | Fan et al. ................................. 438/34 |
| 5,677,924 | * 10/1997 | Bestwick .................................. 372/96 |

FOREIGN PATENT DOCUMENTS

| 0 499 659 | 8/1992 | (DE) . |
| 0 704 947 | 4/1996 | (EP) . |
| 09223848 | 8/1997 | (JP) . |

OTHER PUBLICATIONS

Uchiyama et al, "Two-dimensional Array of GaInAsP/InP Surface-Emitting Lasers", Electronics Letters, 14$^{th}$ Feb. 1985, vol. 21, No. 4, pp. 162–164.

Babic et al "Double-Fused 1.5$\mu$ m Vertical-Cavity lasers", Applied Physics Letters, vol. 66, No. 9, Feb. 27, 1995, pp. 1029–1032.

Hayashi et al, "Record Low-Threshold Index-Guided InGaAs/GaAlAs Vertical-Cavity Surface Emitting Laser with a Native Oxide Confinement Structure," Electronics Letters, 30$^{th}$ Mar. 1995, vol. 31, No. 7, pp. 560–562.

* cited by examiner

Primary Examiner—Teresa M. Arroyo
Assistant Examiner—Quyen Phan Leung
(74) Attorney, Agent, or Firm—Fitzpatrick, Cella, Harper & Scinto

(57) ABSTRACT

A surface-type optical device, such as a surface emitting laser device, includes a first substrate, a plurality of active regions formed and disposed on the first substrate, and a control unit for injecting a current into or applying an inverse voltage to each active region. A portion of the first substrate is removed over an area including at least two active regions. The active region is constructed such that light is output from or input into each active region perpendicularly to the first substrate. A second substrate may be bonded to a side of the epitaxially-grown layers of the first substrate.

30 Claims, 11 Drawing Sheets

SURFACE-TYPE OPTICAL DEVICE, FABRICATION METHOD THEREFOR AND DISPLAY DEVICE

BACKGROUND OF THE INVENTION

1. Field of the Invention

The present invention relates to a surface-type optical device, such as a vertical cavity surface emitting laser (VCSEL), whose fabrication is easy, whose yield can be increased and which is suitable for use in a two-dimensional array structure, to its fabrication method and to a display device using the surface-type optical device.

2. Related Background Art

Recently, development of a solid-state light emission device of a two-dimensional array type has been desired for the purpose of its applications to large-capacity parallel optical information processing, high-speed optical connection and panel-type display apparatus. Low cost, low consumption of electric power, high productivity, and high reliability are required to achieve those applications. Various materials for such a surface emitting solid-state device have been studied and developed. It has been found that single-crystalline semiconductors are notably suitable for reliability. Especially, development of a surface emitting device using compound semiconductor has been energetically advanced. With this compound semiconductor, light emission is possible over a wide range from ultraviolet to infrared by changing materials of its substrate and layer structure. Hence, that material is prospectively seen as a display device.

Among light emission devices, a laser diode (LD) including reflection mirrors at its opposite ends is most excellent in light emitting efficiency, compared to devices using spontaneous emission. Therefore, electric power consumption can be greatly lowered when those LDs are arranged in a two-dimensional manner. With this point in view, development of the VCSEL has been actively advanced in recent years.

With the VCSEL, devices have also been developed over a range from a blue color at a wavelength of about 400 nm to a communication wavelength band of 1.55 $\mu$m. Studies have been made in material series, such as the AlGaN/InGaN series on a sapphire substrate, the InGaAlP/InAlP and InGaAs/AlGaAs series on a GaAs substrate, and the InGaAs/InGaAsP series on an InP substrate.

The fundamental structure of two-dimensional arrayed VCSELs is illustrated in FIG. 1. Laser light is emitted perpendicularly to a substrate 1101. Each device is provided with high-reflective coatings 1109 and 1110 of over 99% reflectivity at opposite end faces of epitaxially-grown layers with a thickness of about several microns. Reference numeral 1114 designates epitaxial layers, reference numeral 1115 designates a light emitting region, and reference numeral 1116 designates an active layer or a light emitting portion.

A multiplicity of alternately-layered layers with different refractive indices and a common $\lambda/4$ thickness are used as the reflective mirror. The materials are generally dielectric (in the case of FIG. 1), or epitaxially-grown semiconductors. Examples of the epitaxially-grown mirror are as follows: a multi-layer mirror of alternately-formed AlAs and GaAs layers (an AlAs/GaAs mirror), an active layer and other layers are deposited on a GaAs substrate during a single growth process, as disclosed in ELECTRONICS LETTERS, 31, p. 560 (1995); and a GaAs/AlAs mirror formed on a GaAs substrate is directly or without any adhesive bonded to a laser structure of an InGaAsP/InP series grown on an InP substrate, as disclosed in APPLIED PHYSICS LETTERS, 66, p. 1030 (1995).

Further, Japanese Patent Laid-Open No. 9-223848 (1997) discloses a VCSEL with epitaxial semiconductor mirrors, in which after a structure of its epitaxial layers including an active layer grown on a semiconductor substrate is bonded to another semiconductor substrate with an integrated circuit by using polyimide adhesive or the like, its laser substrate is all removed and devices are thus separated from each other, as illustrated in FIG. 2. In such a manner, a semiconductor device with integrated VCSELs and other electric devices is fabricated. In FIG. 2, reference numeral 4100 designates a light input and output substrate, reference numeral 4100A designates a light receiving device, reference numeral 4100B designates a VCSEL, reference numerals 4100C and 4100D designate electric wires of the devices 4100A and 4100B, respectively, reference numeral 2000 designates an integrated-circuit substrate, reference numeral 2000A designates a metal wire of the integrated-circuit substrate 2000, reference numeral 3000 designates an insulating layer, and reference numeral 4000 designates an electric wire. With this construction, a high-density array is possible.

However, where a set of the epitaxial semiconductor layers is used as multi-layer mirror, the difference in refractive indices between the different semiconductor layers cannot be large in the case of InGaAsP/InP, for example. Therefore, the number of the epitaxial layers increases, and its growth time and its thickness are also increased. Thus, its productivity is lowered, and processing of the device and flattening of the surface are difficult to perform.

Further, practical materials for use as the semiconductor mirror are presently GaAs/AlAs, and when their lattice constants are considered, the choice of usable materials of the active layer is limited and its oscillation wavelength band is hence restricted. Where the GaAs/AlAs mirror is directly bonded, the size of the semiconductor substrate is limited although another wavelength band is available due to an expanded range of usable materials for the active layer. This method is thus effective in the case of a small area only.

On the other hand, the dielectric multi-layer mirror cannot be directly laid down on the substrate, although its fabrication is easy. Therefore, the layering needs to be performed after the bottom face of the substrate 1101 is etched to open a window 1101a, as illustrated in FIG. 1. Accordingly, the window 1101a must be precisely formed, and windows 1101a cannot be formed so close to each other. As a result, its yield and uniformity are low or bad, and devices cannot be formed with high density, leading to unsuitability of the devices for a two-dimensional arrayal.

Further, also in the case of the epitaxially-grown mirror, the substrate comes to be an absorptive material depending on the oscillation wavelength band, and thus a hole must be etched in the substrate as illustrated in FIG. 1 when oscillation light is to be taken from the substrate side. Hence, high-density arrayal is also difficult in this case.

Furthermore, in the device as illustrated in FIG. 2, the substrate is not a substrate of transparent material, and therefore light cannot be taken from the substrate side. Further, since an electrode wiring is formed for each light emitting portion at its stepped portion, the wiring process is difficult and its yield is degraded.

Particularly, when the dielectric multi-layer mirror is to be formed on the semiconductor layer of the structure as illustrated in FIG. 2, the yield is drastically injured.

SUMMARY OF THE INVENTION

An object of the present invention is to provide a surface-type optical device whose growth substrate is removed over an area of plural active regions and which is suitable for a two-dimensional surface-type optical device of an array-type whose fabrication is simple and whose productivity is high, and to its fabrication method and a display apparatus using such a surface-type optical device.

A surface-type optical device for achieving the object of the present invention includes a first substrate, a plurality of active regions formed and disposed on the first substrate (growth substrate), and a control unit for injecting a current into or applying an inverse voltage to each active region. A portion of the first substrate is removed over an area including at least two active regions, and each active region is constructed such that light is output from or input into the active region perpendicularly to the first substrate. In this structure, hole-etching of the substrate is executed over the plural active regions (not for each active region), so that intervals between the active regions can be narrowed without considering interference between etched holes and even a high-density array can be readily produced with high productivity.

Based on the above fundamental structure, the following specific structures are possible, with the following technical advantages.

The active regions are arrayed, and a portion of the growth substrate is removed over an area of all the arrayed active regions. A desired number of the active regions are arranged in a two-dimensional array, for example, and the growth substrate is removed in the overall area. Therefore, even when the active regions are arrayed with a high degree of integration and high density, the hole-etching can be effected stably and accurately.

A portion of the growth substrate (e.g., a frame form) is left outside all the arrayed active regions. A process of the hole-etching can be readily conducted and a mechanical strength of the device can be secured, so the reliability can be improved.

The active regions are arrayed, and a portion of the substrate is left in a lattice-shaped form over an area of all the arrayed active regions. Adequate mechanical strength can be secured even if the growth substrate is not bonded to another substrate. Accordingly, its reliability can be improved with a simple structure.

The growth substrate with the active regions arrayed thereon is bonded to a second substrate with the active regions interposed between the growth substrate and the second substrate. Adequate mechanical strength can be secured by a simple process, and its reliability can be improved.

The control unit includes a common electrode common to the active regions formed on a remaining portion of the growth substrate. When the growth substrate is electrically conductive (typically, impurity-doped semiconductor), an electrode on the side of the epitaxially-grown layers can be simply formed on the remaining portion of the growth substrate as a common electrode.

The control unit includes an electrode wire pattern formed in the area including at least two active regions (an area where the growth substrate is removed) to take out each electrode from each active region. Thus, the active regions can be independently driven by such an electrode structure.

The first substrate with the active regions arrayed thereon is bonded to a second substrate with the active regions interposed between the first and second substrates, the control unit includes an electrode pattern formed on a surface of the active regions, to which the second substrate is bonded, and the electrode pattern is exposed by a removal of an outermost portion of the first substrate and a portion of the active regions to take out each electrode from each active region. Thus, the active regions can be independently driven similarly.

The first substrate with the active regions arrayed thereon is bonded to a second substrate with the active regions interposed between the first and second substrates, and the control unit includes an electrode pattern formed on a surface of the second substrate, to which the first substrate is bonded such that the electrode pattern is electrically connected to each active region to take out each electrode from each active region. Thus, the active regions can be independently driven similarly.

The control unit includes positive and negative electrodes formed in a matrix form such that each active region can be driven independently. When the number of the arrayed active regions is large, the patterning will be too complicated if an independent driving of the respective pixels is conducted by the electrode patterning. In such a case, the matrix driving is advantageous.

The first substrate with the active regions arrayed thereon is bonded to a second substrate with the active regions interposed between the first and second substrates, and the second substrate is a semiconductor substrate with an electronic circuit formed thereon. Thus, an opto-electronic integrated circuit with an electronic circuit and a surface-type optical device can be readily formed on a common Si substrate, for example.

The active region includes a light emission layer such that a surface emitting device for emitting light perpendicularly to the first substrate is formed. A surface emitting device, such as a surface emitting semiconductor laser, can be thus formed. In this case, the surface emitting device may be a vertical cavity surface emitting laser with a pair of reflection mirrors provided on opposite sides of the light emission layer. Further, the surface emitting device may be a light emitting device with at most a reflection mirror provided on one side of the light emission layer.

The active region has a light absorptive layer such that a surface-type light receiving device for receiving light input perpendicularly to the first substrate is formed. In this case, the surface-type light receiving device may be a light receiving device with at least a reflection mirror provided on at least a side of the light reception layer. Input light can be effectively received by the light absorptive layer due to collection of light by the reflection mirror.

The active region includes at least a reflection mirror consisting of two kinds of dielectric layers (such as dielectric glass) which are alternately layered. A surface-type optical device can be thus formed at a relatively inexpensive cost.

The active region includes at least a reflection mirror consisting of two kinds of semiconductor layers which are alternately layered. In this case, the mirror can be fabricated successively to other epitaxial layers during a single process, so its fabrication process can be simplified.

The first substrate with the active regions arrayed thereon is bonded to a second substrate of a transparent material with the active regions interposed between the first and second substrates, each active region includes a light emission layer such that a surface emitting device for emitting light perpendicularly to the first substrate is formed, and a fluorescent substance is provided between the surface emitting device and the second substrate such that display can be performed by light of a color at an emission wavelength of the surface emitting device or light of a fluorescence color generated when the fluorescent substance is stimulated by the light from the surface emitting device. When a two-dimensional surface emitting device of an array type is formed and fluorescent substances of R (red), G (green) and B (blue) are provided for each emission point, an all-solid-state full-color display apparatus can be obtained with high productivity.

The active region includess layers of compound semiconductor consisting of a III-group element selected from B, Al, Ga and In and a V-group element, N, or an active layer of an oxide of Zn and clad layers of an oxide of Mg. Thus, a surface emitting device, such as a highly-efficient LD or LED, for emitting light from blue to ultraviolet can be fabricated, and a high-luminance full-color display apparatus can be provided.

The active region may preferably have a current constriction structure for constricting a current flow.

A fabrication method of a surface-type optical device for achieving the object of the present invention includes a step of epitaxially growing layers including an active layer on a first substrate, a step of forming a plurality of active regions on the first substrate, each of which is constructed such that light is output from or input into each active region perpendicularly to the first substrate, and a step of removing a portion of the first substrate over an area including at least two active regions. The removing step may be performed after or before the forming step.

A step of bonding a side of the epitaxially-grown layers of the first substrate to a second substrate may be further performed. The removing step may be performed after or before the bonding step.

A step of forming a current constriction structure for constricting a current flow to the active layer in the active region may be further performed.

A step of forming a reflection mirror on a side of the epitaxially-grown layers of the first substrate may be further performed.

A step of forming a reflection mirror on a face of the epitaxially-grown layers exposed by the removing step of the first substrate may be further performed.

The principle of the present invention will be described using an example (this is a first embodiment, described below).

A hole-etching of a growth substrate is performed only over a two-dimensional array area of light emission regions, after the growth substrate is bonded to another substrate, such as Si, as illustrated in FIG. 3A. Thus, the growth substrate is left, for example, in a frame shape in an area outside the area of the light emission regions. Intervals between the light emission regions (pixels) can hence be decreased, and a highly-dense integration of those pixels is made possible. In this case, an electrode can be taken from the side of the growth substrate. Where no epitaxial mirror is provided on the substrate, a dielectric multi-layer mirror only needs to be formed after the etching of the growth substrate.

In the structure of this example, an essential element of the present invention only consists in that a plurality of active regions (such as light emission layers and light absorption layers) are arranged on a common growth substrate and that the growth substrate is partially removed only in a portion wherein at least two active regions are formed.

Other specific structures are not essential to the present invention, but are only particular to this example.

The fabrication method of the example will be briefly described using FIGS. 4A and 4B. As illustrated in FIG. 4A, a laser structure in the form of an active layer sandwiched between p-type and n-type clad layers is epitaxially grown on a semiconductor substrate of a single crystal, a region around the light emission region is etched into an annular shape, and the etched groove is buried with polyimide or the like. The light emission region is shaped into, for example, a cylinder with a diameter of 20 $\mu$m, and the etched annular shape has an outer diameter of 40 $\mu$m. Here, the periphery of the active layer is selectively wet-etched by several microns to be shaped into a circle with a diameter of about 15 $\mu$m, considering the effective diameter of a reflection mirror to be fabricated later. As illustrated in FIG. 4B, after an electrode is formed, the electrode and the semiconductor cap layer are etched into a circular shape of a diameter about equal to that of the active layer, and a dielectric multi-layer mirror is formed using a RF sputtering method or the like.

As illustrated in FIG. 4C, the substrate is polished to a thickness of about 100 $\mu$m, and an electrode is then formed on the bottom surface of the substrate and annealed. Thereafter, after the side of the dielectric mirror of the growth substrate is bonded to an InP substrate with its thermally-oxidized surface thereon, for example, the electrode and semiconductor substrate are removed except the frame-shaped portion. The bonding is conducted using an adhesive of a type which softens when heated, or a direct bonding with a solid-phase junction. The removal of the substrate is performed using wet etching, dry etching, or their combination.

As illustrated in FIG. 4D, a dielectric mirror is then formed only over the etched area of the growth substrate by using a lift-off method or the like, and the electrode on the side of the epitaxial layers is exposed by etching an outer portion of the frame-shaped substrate. Such a VCSEL array as illustrated in FIG. 3A can be fabricated.

Since those light emission regions can be arranged in a two-dimensional array on the original semiconductor substrate, a surface-emitting type array device can be readily fabricated. Regarding the etching of the semiconductor substrate, holes are not individually etched for the respective pixels differently from the prior art device, and instead the substrate is etched over the array area, so that no limitations is imposed on either the device intervals or the yield.

Further, the area of the device can be enlarged according to the present invention, compared to the case where the semiconductor mirror is directly bonded. The size of the device is generally limited by the size of the semiconductor substrate (about a 3-inch diameter in the case of compound semiconductor), but the size of the device can be further expanded by bonding the substrates to another support substrate. An independent electrode can be taken from each pixel on the growth substrate side, or electrodes on the support substrate side and the growth substrate side can be patterned in a matrix form as illustrated in FIG. 5 to attain the electrical conduction. Portions between the light emission regions (pixels) can be etched and polyimide can be put thereinto to prevent interference of current. Such an array laser can be applied to a two-dimensional array light source for use in optical information processing or optical interconnection. Further, such an array device can be formed of material capable of emitting blue or ultraviolet light, and such a device can be applied to a full-color display device in which fluorescent substances of R , G and B are deposited on a glass surface.

DESCRIPTION OF THE PREFERRED EMBODIMENTS

First Embodiment

Figure 1:
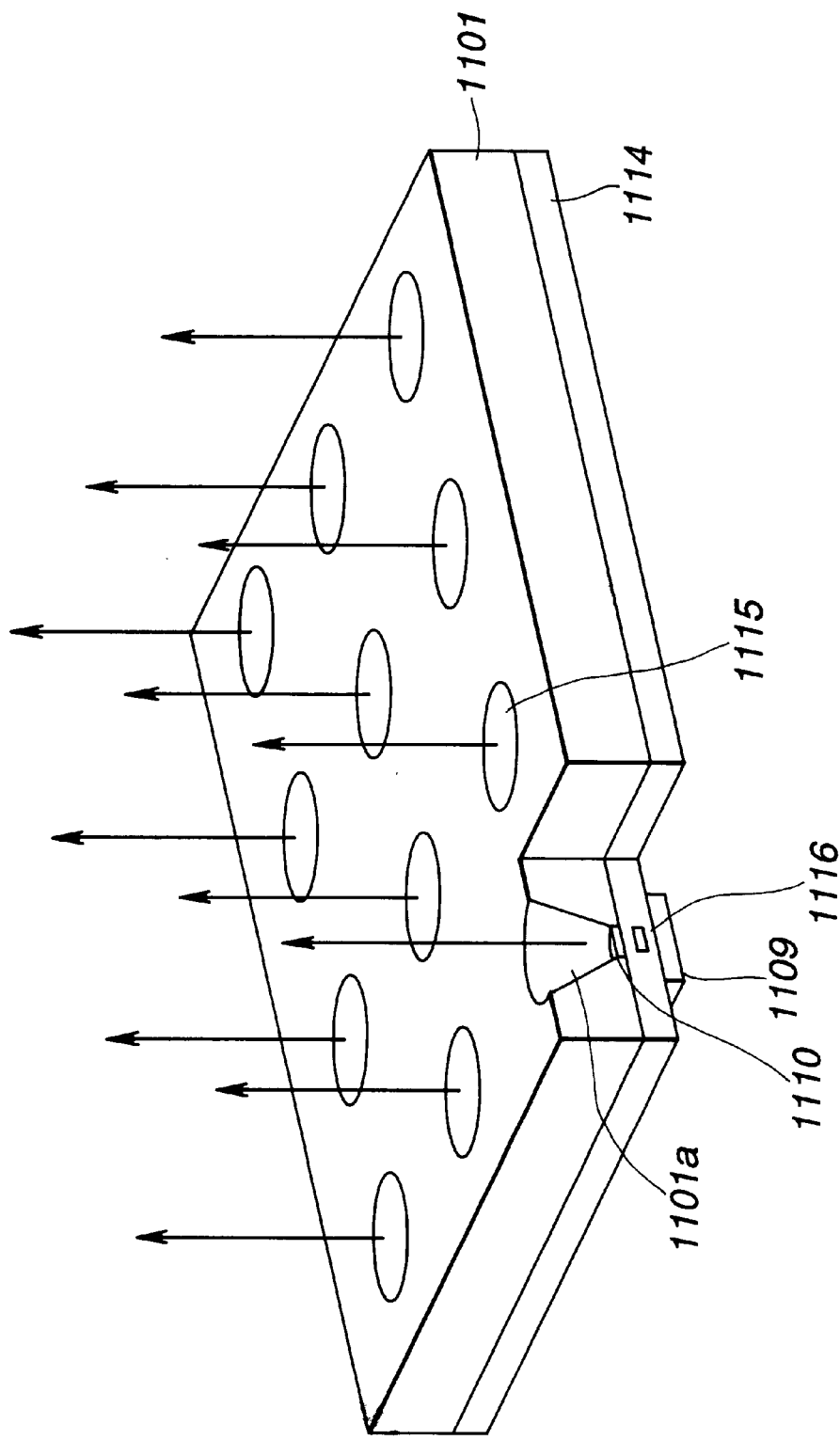
FIG. 1 is a perspective view with a cut-away portion illustrating the structure of a first prior art VCSEL array.
Figure 2:
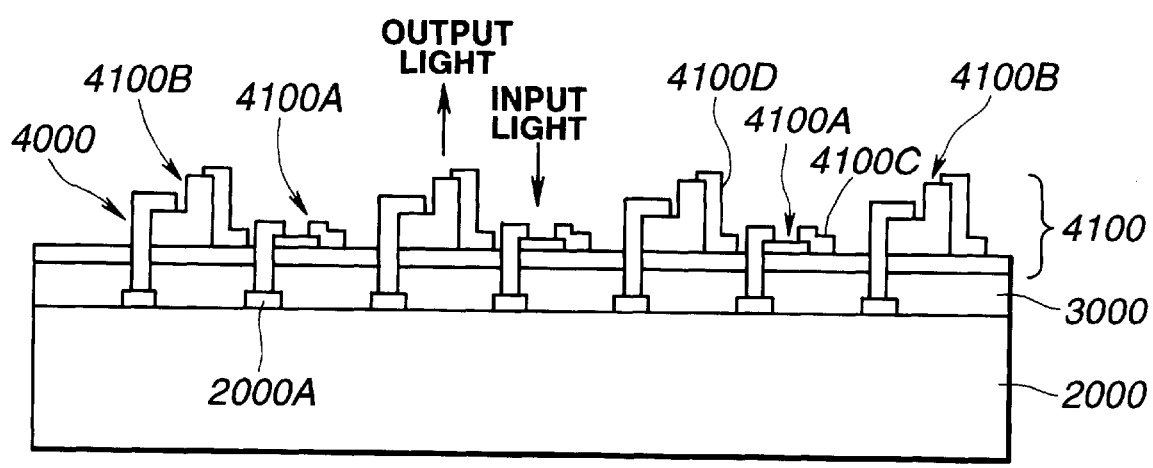
FIG. 2 is a cross-sectional view of a second prior art device.
Figure 3A:
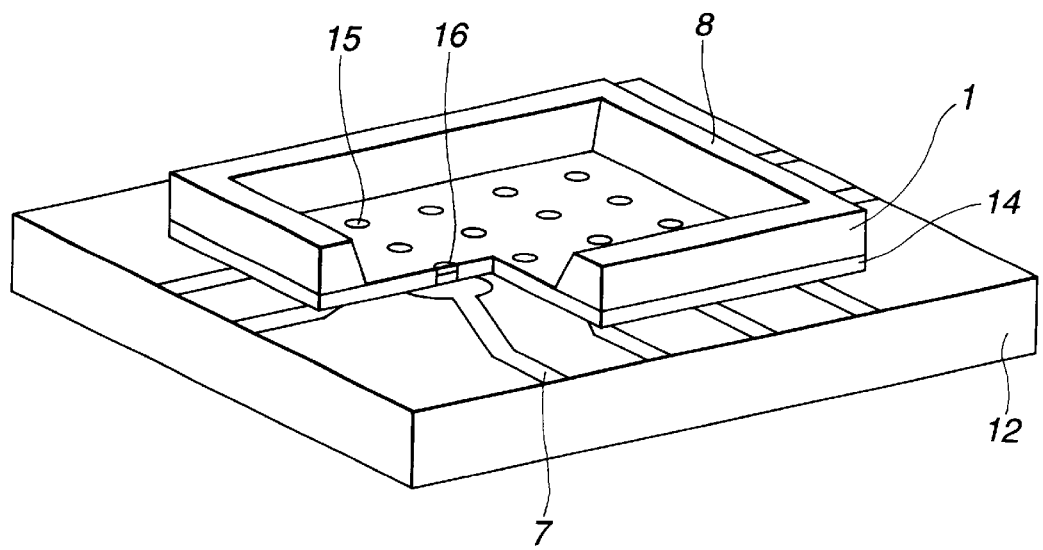
FIG. 3A is a perspective view with a cut-away portion illustrating the structure of a VCSEL array of a first embodiment according to the present invention.
Figure 3B:
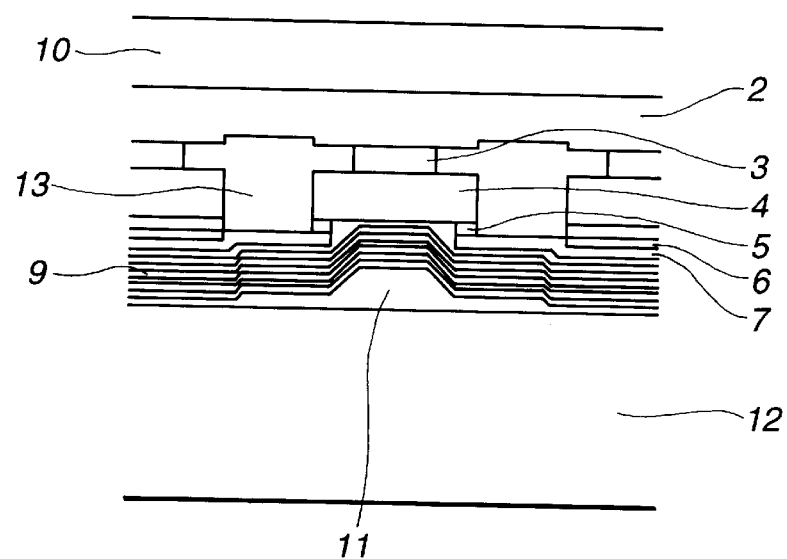
FIG. 3B is a cross-sectional view illustrating the structure of a single active region of the first embodiment.

A first embodiment of the present invention is directed to a VCSEL array in which each VCSEL of an InGaAs/InGaAsP series with a 1.3-$\mu$m wavelength band grown on a single crystal semiconductor substrate 1 of InP is bonded to a Si substrate 12 whose surface is insulated by thermal oxidization. FIG. 3A illustrates its overall perspective view with a cut-away portion, and FIG. 3B illustrates a detailed cross-sectional view of a light emitting region (or a pixel) of the VCSEL array.

In the first embodiment, an active layer 3 is sandwiched between n-type and p-type clad layers 2 and 4, and dielectric multi-layer mirrors 9 and 10 are provided at its opposite ends. The dielectric multi-layer mirror 9 is bonded to the Si substrate 12 by an adhesive 11. Patterning of an electrode 7 at the Si-substrate side is made such that a current can be independently injected into each pixel, as illustrated in FIG. 3A. After the thus-formed wafer is bonded to the Si substrate 12 and the semiconductor substrate 1 is etched into a frame-like shape, the substrate 1 and an epitaxially-grown layer 14 at the periphery of the frame are partially removed to expose the electrode 7. The patterned electrode 7 is thus taken out. An electrode 8 on the side of the semiconductor substrate 1 is taken out as a common electrode to each pixel since a portion of the electrically-conductive substrate 1 is left in such a frame-like shape as illustrated in FIG. 3A. In FIG. 3A, dielectric mirrors 9 and 10 are omitted for the convenience of simple understanding, a pixel 15 is depicted in the form of an outer periphery of the active layer 3, and a light emitting layer 16 represents the active layer 3 itself.

A fabrication process of the first embodiment will be described with reference to FIGS. 4A–4D.

Figure 4A:
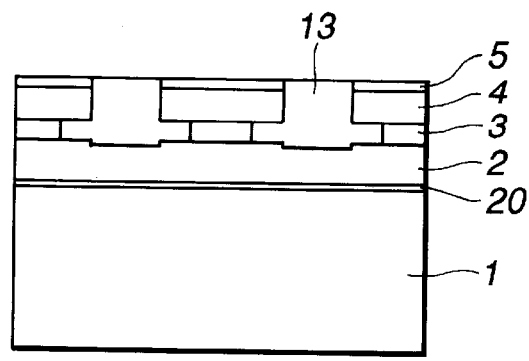
FIGS. 4A through 4D are respectively cross-sectional views illustrating fabrication steps of the first embodiment.

Initially, as illustrated in FIG. 4A, an n-InGaAs contact or etching stop layer 20, the n-InP clad layer 2, the strained multi-quantum well active layer 3 of undoped InGaAs/InGaAsP, the p-InP clad layer 4 and a p-InGaAs contact layer 5 are grown on the n-InP substrate 1 in the named order using a chemical beam epitaxy (CBE) method or the like. Layers down to the active layer 3 around the light emitting region are perpendicularly etched in an annular shape with an inner diameter of 20 $\mu$m and an outer diameter of 40 $\mu$m, using a reactive ion beam etching (RIBE) method or the like.

Then, the side end of the InGaAs contact layer 5 is covered with a resist, and only the side end of the active layer 3 is etched several microns by a selective wet etching, so that the active layer 3 is thinned into a circular shape with a diameter of about 15 $\mu$m. The diameter of the active layer 3 is thus made approximately equal to the effective diameter of the dielectric multi-layer (described later) to constrict the injected current to a necessary degree. The oscillation operation can hence be made efficient and preferable. When a mixture of sulfuric acid, hydrogen peroxide water and water (in the ratio of 3:1:1) is used as etchant, the InP clad layers 2 and 4 are not etched at all and the active layer 3, solely, is etched completely (thus, highly selective etching is achieved).

Further, there is a face-orientation dependency during the etching, so that when a (100) substrate is used, (010) face, (001) face and their inversely-oriented faces appear to form the active layer 3 of an approximately square shape. In this case, the anisotropy of gain occurs in the active layer 3, and polarization of the oscillation light is stabilized. Accordingly, the problem of kinks and the like due to a polarization instability of oscillation light in a conventional VCSEL can be solved. The thus-formed groove is buried with a polyimide 13 or the like.

Figure 4B:
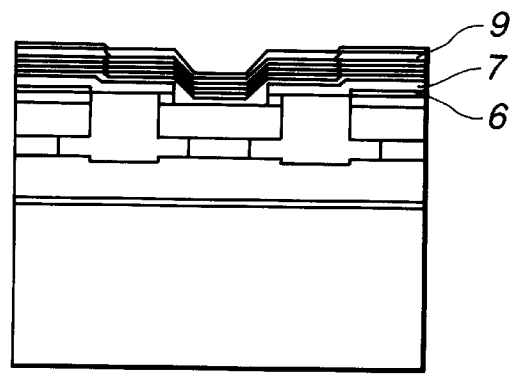

Then, as illustrated in FIG. 4B, insulation is secured at the outer periphery of each pixel by forming a SiN layer 6 around the pixel. The p-side electrode 7 is formed by the patterning and deposition of Cr (its thickness: 500 Å)/Au (its thickness: 5000 Å). Within the pixel, circular portions of the electrode 7 and the contact layer 5 slightly larger than the active layer 3 are removed. Thereafter, the dielectric multi-layer 9 consisting of six pairs of Si/Al$_2$O$_3$ with a common thickness of $\lambda$/4 ($\lambda$: a real wavelength in the layer of the oscillation wavelength) is formed using an RF sputtering method or the like. In this step, annealing of the electrode 7 is conducted to obtain the electrode contact.

Then, after the InP substrate 1 is polished to a thickness of 100 $\mu$m (the thickness as illustrated in FIG. 3A), the n-side electrode 8 of AuGe (its thickness: 2000 Å)/Au (its thickness: 3000 Å) is vacuum-evaporated and annealed to establish the electrode contact. Patterning is performed to leave an outer portion of the array region in the frame shape as illustrated in FIG. 3A, and only a portion of the electrode 8 in the region for hole-etching is removed.

Figure 4C:
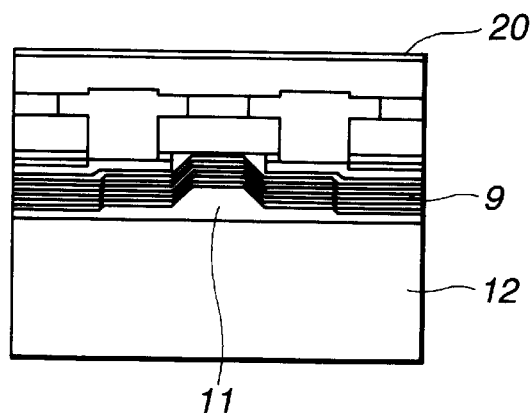

As illustrated in FIG. 4C, the dielectric multi-layer 9 is bonded to the thermally-oxidized Si substrate 12 with the adhesive 11, and the hole-etching of the substrate 1 is executed using chloric acid. The InGaAs contact or etching stop layer 20 is thus exposed. Since InGaAs cannot be etched by the chloric acid, the etching is completely stopped at the etching stop layer 20. The above bonding is performed by inserting a sheet of polyimide series between the multi-layer 9 and the substrate 12 and heating it to 200° C.

Figure 4D:
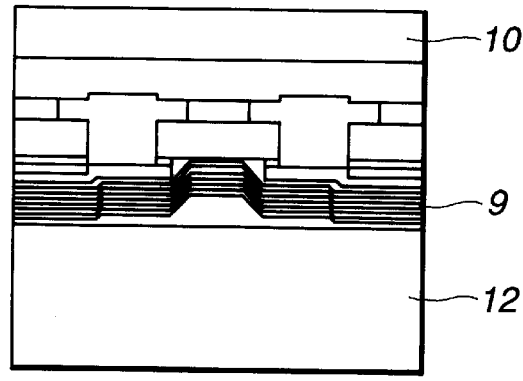

Finally, as illustrated in FIG. 4D, the etching stop layer 20 is removed using an etchant of sulfuric acid series, and the dielectric multi-layer 10 consisting of six pairs of Si/$Al_2O_3$ is formed in the region of the VCSEL array only, using an RF sputtering method or the like. No multi-layer is formed on the frame for exposing the electrode 8. The outer periphery of the epitaxial layer 14 is etched and removed to expose the bonding-side electrode 7. The structure illustrated in FIG. 3A is thus completed.

When a multiplicity of the thus-formed pixels 15 are arranged on a semiconductor substrate, a high-density two-dimensional array laser with a low threshold can be readily fabricated. The 3×4 array of twelve pixels is illustrated in FIG. 3A, but the number can be increased. Further, when pixels are fabricated on each semiconductor substrate and the thus-formed substrates are bonded to another substrate in an appropriate arrangement, the number of the arrayed pixels can be further increased. In the first embodiment, each pixel can operate in a good condition even with the pixel interval of 100 μm.

Although the substrate 1 of the first embodiment is shaped into a frame as illustrated in FIG. 3A, only one side or a part of one side of the frame may be left in place of the entire frame, provided that there exists a remaining region for establishing a contact with the electrode 8.

Such a two-dimensional array laser can be used as a light source for high-speed parallel information transmission, optical interconnection and optical information processing.

In the first embodiment, the structure of the InGaAsP/InP series is formed on the InP substrate, but the choice of material series is not limited thereto, and the structure can be built in another wavelength band. The present invention can also be applied to the AlGaN/InGaN series on a sapphire substrate, and the InGaAlP/InAlP, InGaAs/AlGaAs and InGaNAs/AlGaAs(GaInP) series on a GaAs substrate. Especially, a 1.3-μm band laser constructed with the InGaNAs/AlGaAs(GaInP) series is superior in temperature characteristics and differential gain, so that the laser can operate without any temperature control. Here, when no heat sink is used and the above-discussed another substrate is transparent, oscillation light can be taken from both upper and lower sides.

Second Embodiment

Figure 5:
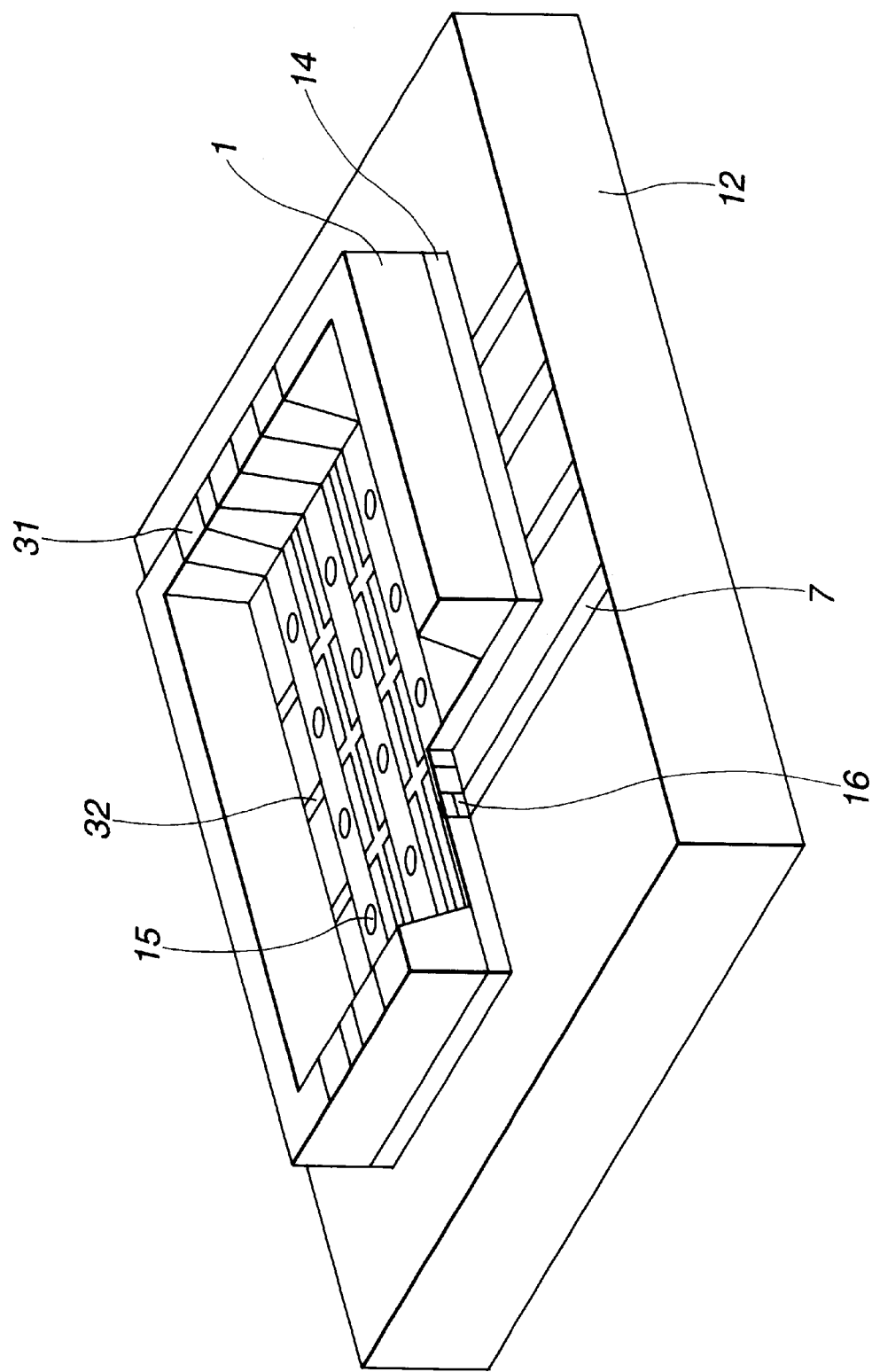
FIG. 5 is a perspective view with a cut-away portion illustrating the structure of a VCSEL array of a second embodiment according to the present invention.

A second embodiment is directed to a VCSEL array in which an electrode 31 is also formed in a hole-etched surface as illustrated in FIG. 5 to effect a matrix driving. For this purpose, stripes of the electrode 7 extend in a column direction, while stripes of the electrode 31 extend in a row direction perpendicular to the column direction. In FIG. 5, the same members as those in FIG. 3A are designated by the same reference numerals.

The first half of the process of the fabrication of the second embodiment is similar to that of the first embodiment. The fabrication is similarly conducted up to the process of FIG. 4C except for the formation of the electrode 8 on bottom surface. The etching stop layer 20 is not removed and is instead used as the contact layer. In the process of FIG. 4C, a process similar to the surface process of FIG. 4B is performed. That is, a SiN layer is formed to secure the insulation of the periphery of each pixel, and an n-side electrode 31 of AuGe (its thickness: 2000 Å)/Au (its thickness: 3000 Å) is formed in a pattern as illustrated in FIG. 5. Circular portions of the electrode 31 and contact layer 20 of a 15-μm diameter are removed in each pixel 15, and a dielectric mirror is formed over the entire array region during the process of FIG. 4D (this mirror is not shown in FIG. 5).

Further, the epitaxial layer 14 can be removed in a cross-striped pattern and the thus-formed groove can be buried with polyimide or the like as illustrated in FIG. 5 to prevent interference of the n-side electrode. This process is executed before the formation of the SiN layer and the n-side electrode 31.

When the number of arrayed pixels is large, the patterning will be considerably complicated if the structure is built such that each pixel is driven with the electrode patterning similar to the first embodiment. Therefore, the matrix driving of the second embodiment is often more advantageous. Further, since a current is caused to flow through a thin layer, such as the clad layer 2, in an in-surface direction in the case of the common electrode of the first embodiment, the resistance may be high and high-frequency characteristic may be poor. The second embodiment can solve those problems.

Third Embodiment

Figure 6:
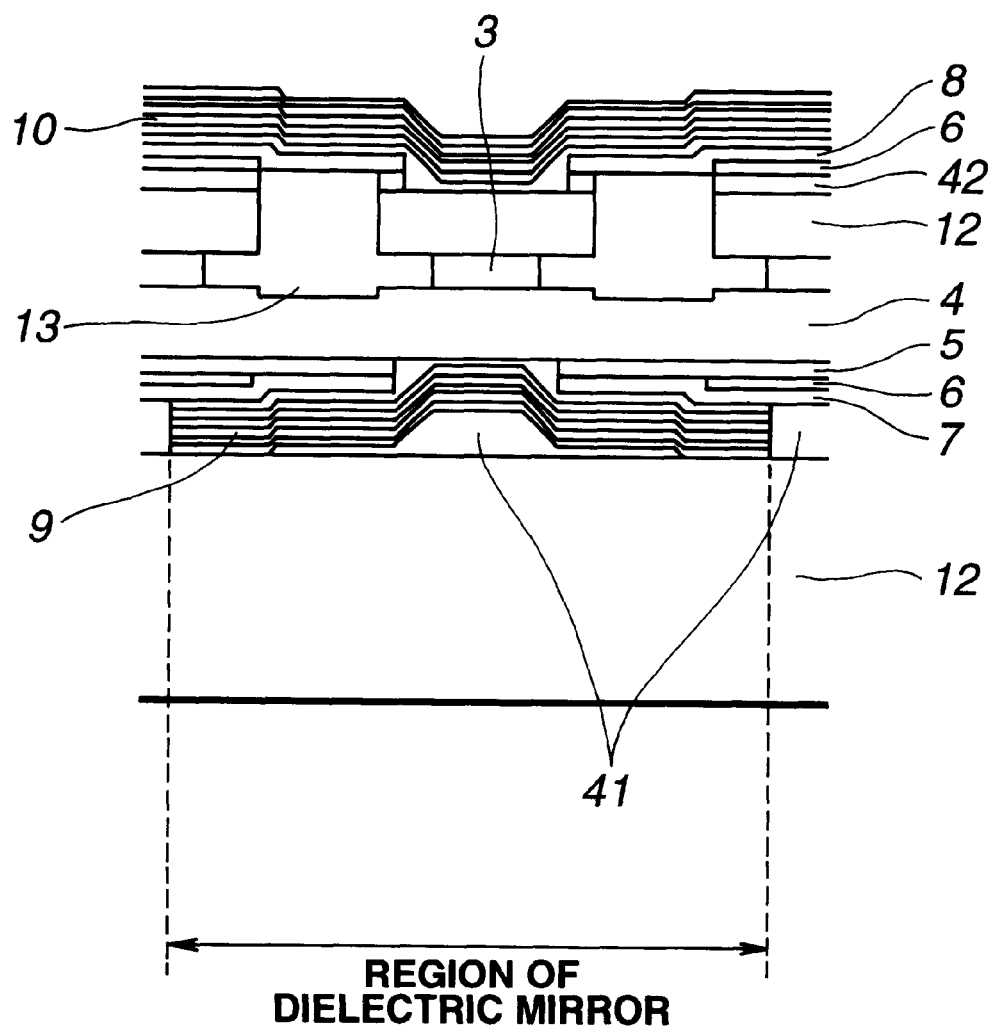
FIG. 6 is a cross-sectional view illustrating the structure of a single VCSEL fabricated by using a solid-phase junction of a third embodiment according to the present invention.

In a third embodiment of the present invention, each pixel 15 as shown in FIG. 6 is formed after the wafer is bonded to the substrate 12 (in FIG. 6, the same members as those in FIG. 3B are designated by the same reference numerals). The materials to be used are the same as those of the above embodiments, and a VCSEL of an oscillation wavelength of 1.55 μm is constructed with the InGaAsP/InP series on an InP substrate.

Similarly to the first embodiment, a substrate to be bonded is the Si substrate 12 with little loss at 1.55 μm whose opposite faces are polished. The final layer of the dielectric mirror 9 is made of Si, and the surface of the Si substrate 12 is directly bonded to sputtered amorphous Si at a heated temperature of 200° C. and with a load applied thereto. Thus, direct bonding is effected without any adhesive.

Here, if the pixel is fabricated beforehand, the bonding to the Si substrate 12 will be difficult owing to the surface unevenness and the influence of the polyimide 13. Therefore, it is desirable to perform the pixel-forming process after the bonding. The process may be done at higher temperatures to increase the bonding strength. Further, if the overall surface is caused to act as a junction surface, the surface is likely to be separated due to stress and so forth. Therefore, it is effective that the dielectric mirror 9 is only formed over a region with a certain area (about a 50-μm diameter in this embodiment) as illustrated in FIG. 6 and that the non-bonded surface without the mirror 9 is caused to act as a relaxation layer. A non-bonded region 41 is a vacant space, so an ambient gas during the bonding process can be introduced within the region 41. When the ambient gas has a negative pressure, a stable bonding state can be maintained. Heat radiation characteristic of the device is superior due to the direct bonding without any adhesive.

The fabrication method and structure of the third embodiment will be described with reference to FIG. 6.

Similarly to the first embodiment, the laser structure is epitaxially grown on the InP substrate (the structure of the active layer 3 is different from that of the first embodiment). After the insulation structure of the SiN 6 is formed, the electrode wiring pattern 7 of Ti (its thickness: 500 Å)/Pt (its thickness: 1000 Å)/Au (its thickness: 3000 Å) is formed as a non-alloy electrode on the InGaAs contact layer 5. No diffusion occurs in the electrode 7 at the time of heating.

Then, circular portions of the electrode 7 and the contact layer 5 are removed with such a diameter (here, 30 μmφ, though depicted a little smaller in FIG. 6) as causes an effective diameter of the multi-layer mirror 9 to have a sufficient amount relative to that of the active layer 3. The multi-layer mirror 9 (whose final layer is Si) of Si/Al$_2$O$_3$ is deposited with a diameter of 50 μm by a lift-off method or the like.

The Si substrate 12 is then bonded as described above. Thereafter, after the InP substrate is removed similarly to the first embodiment, the formation process of the pixel is executed. The electrode 8 is formed in such an electrode pattern as illustrated in FIG. 5, so that the pixels 15 can be driven independently from each other. In FIG. 6, reference numeral 42 designates an etching stop or contact layer.

When the device is operated, light may be taken out from the side of the Si substrate 12, or from the side where no Si substrate 12 is bonded as a heat sink.

In the third embodiment, the optical device and an integrated circuit fabricated on the Si substrate 12 can be provided on a common substrate, and hence an opto-electronic integrated device can be constructed at a relatively inexpensive cost. The optical device can be readily positioned even in a narrow location since no adhesive is used.

Figure 11:
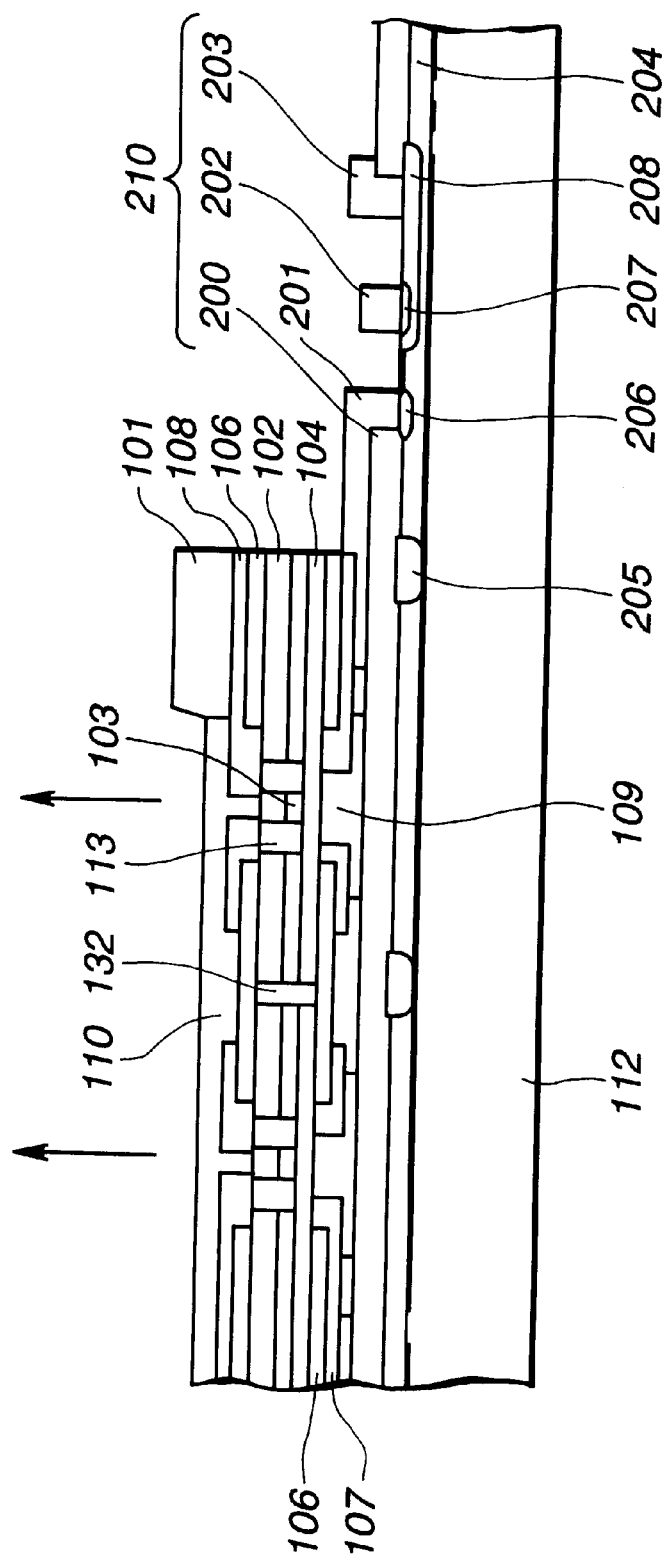
FIG. 11 is a cross-sectional view illustrating the structure, in which a VCSEL array and an electronic circuit are integrated, of an eighth embodiment according to the present invention.

An example of such an opto-electronic integrated device is illustrated in FIG. 11. FIG. 11 depicts an integration portion between the pixel (surface emitting laser) array and a bipolar transistor 210 for driving the surface emitting laser, which transistor is formed at a final stage of the integrated circuit formed on a Si substrate 112. A dielectric mirror 109 is directly bonded, in a solid phase, to a SiN$_x$ layer 200 which is a protective layer for a bare chip of Si devices. The solid-phase bonding between Si's is executed in the above-discussed fabrication process, but the bonding between Si and the SiN$_x$ layer is similarly possible. Only a portion of the SiN$_x$ layer 200 on a surface layer of the Si bare chip in a region, which is to be bonded to the surface emitting laser, may be removed, and the bonding may be performed to such a revealed surface of the Si substrate 112. It should be noted that the process temperature would not be raised too much when the bonding to a Si substrate with an integrated circuit thereon is performed.

In the bonding process, a laser electrode 107 and a collector electrode 201 of the transistor 210 are aligned with each other, and the driving transistor 210 is thus connected to each surface emitting laser. The transistor 210 is an npn-type in which the electrode 201 formed on an n-diffusion region 206 is a collector, an electrode 203 formed on a p-diffusion region 208 is a base and an electrode 202 formed on an n-diffusion region 207 is an emitter.

In FIG. 11, reference numeral 204 designates an n-diffusion region initially formed on the substrate 112, and reference numeral 205 designates a p-diffusion region for separating devices from each other. Further, reference numeral 101 designates a growth substrate, reference numeral 102 designates an n-clad layer, reference numeral 103 designates an undoped active layer, reference numeral 104 designates a p-clad layer, reference numeral 106 designates an insulating layer, reference numeral 108 designates an n-side electrode, reference numeral 110 designates a dielectric mirror, reference numeral 113 designates polyimide put in a groove portion, and reference numeral 132 designates polyimide put in another groove portion for preventing interference between the n-side electrodes 108.

The electrodes of the transistor other than the collector electrode 201 are connected to a CMOS circuit or the like formed on the Si substrate 112 through electric wires. The other electrode 108 of the surface emitting laser is also connected to a power source or the like through a wire pattern formed on the substrate.

Fourth Embodiment

In a fourth embodiment of the present invention, an electrode pattern, which is formed on the side of the epitaxial layers in the above embodiments, is formed on the substrate to be bonded, and the electrode pattern is bonded and electrically connected to an electrode pad in a simple shape formed at each pixel.

Figure 7:
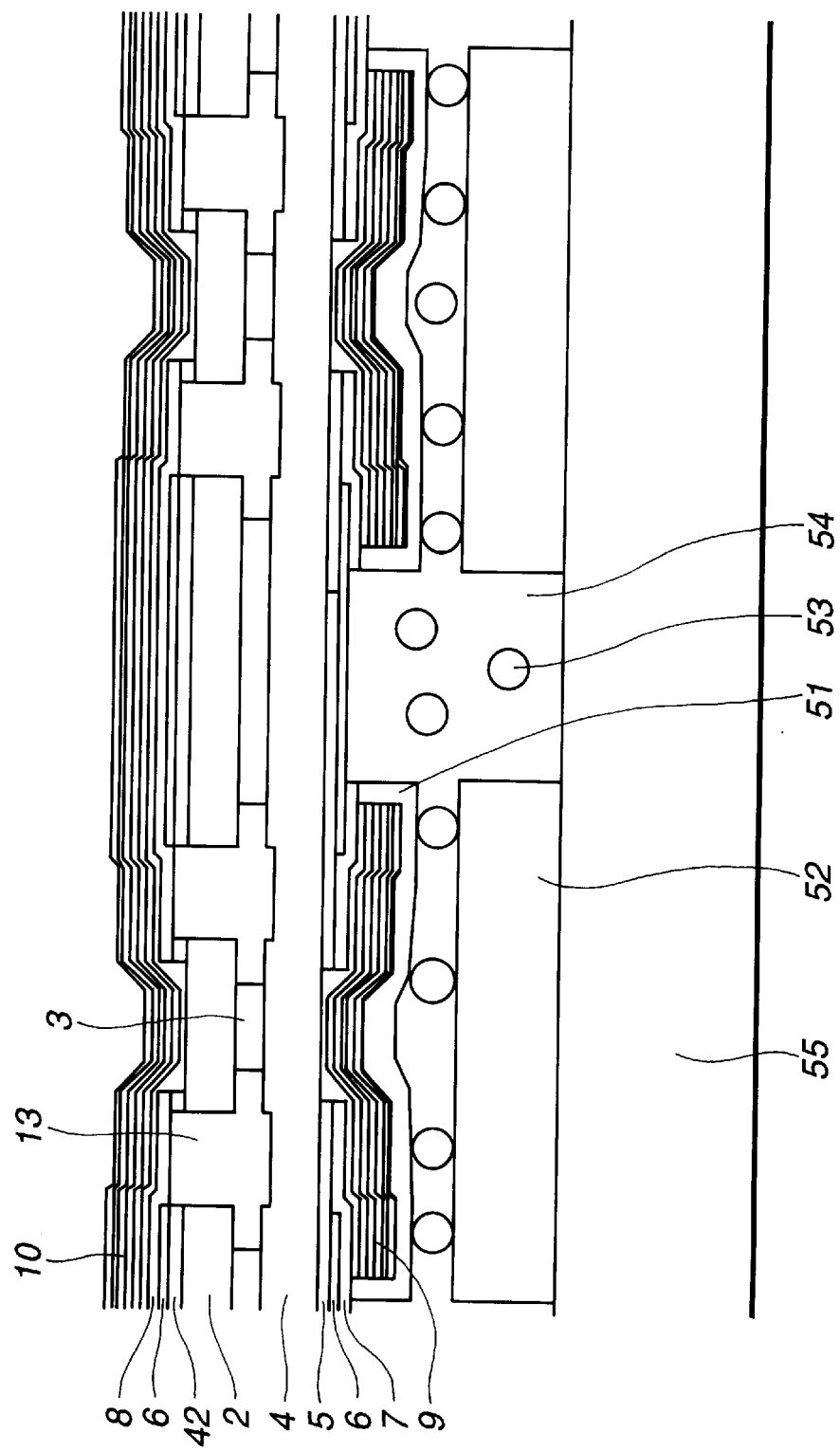
FIG. 7 is a cross-sectional view illustrating the structure of a VCSEL (two VCSELs are depicted) fabricated by using an adhesive containing electrically-conductive particles of a fourth embodiment according to the present invention.

In the structure as illustrated in FIG. 7 (in FIG. 7, the same portions as those in FIG. 6 are designated by the same reference numerals), Au 51 is deposited on the side of the pixel such that electrical conduction can be established between an upper portion of the dielectric mirror 9 and the electrode contact 7 of the pixel. Electrical conduction between the Au 51 on the upper portion of the dielectric mirror 9 and an electrode pattern 52 on the side of a substrate 55 is attained by a polyimide-series adhesive 54 containing electrically-conductive particles 53. The adhesive 54 has characteristics that electrical conduction can be achieved only between the electrode pads 51 and 52 while no conduction is established between recesses of stepped portions on both lateral sides of the electrode pads 51 and 52.

The wiring pattern is formed of a plating 52 of Cu/Ni/Au with a thickness of about 15 μm on the resin substrate 55. After the alignment between the electrode pads 51 and 52 is effected by using infrared transmitting light, the bonding thereof is conducted by heating it to 200° C. while applying a load thereto. The dielectric mirror 9 has a diameter of 50 μm similarly to the third embodiment, and its height is 2 μm. As illustrated in FIG. 7, the conductive particles 53 are inserted between the two electrode pads 51 and 52 and the electrical conduction is secured therebetween, while no electrical conduction is attained in regions without any pad since those particles 53 are not connected to each other therein. Vacant portions on the bonding side are filled with the polyimide adhesive 54.

The pixel is formed similarly to the third embodiment. Regarding the structure of the VCSEL in FIG. 7, the growth substrate is removed and the pixels are fabricated after the bonding step, similarly to the third embodiment. The pixel, however, may be fabricated prior to the bonding step as in the first embodiment. Further, the electrode wiring pattern is the same as that in FIG. 3A or FIG. 5.

In the fourth embodiment, since only the required portions can be electrically connected readily and positively, this embodiment can be especially effectively used where the wiring pattern is more complicated and denser than that in the above embodiments. Further, heat radiation characteristics of the device of the fourth embodiment are better than those of the first embodiment since the adhesive containing the conductive particles is used.

So-called anisotropic electrically-conductive adhesive, in which conductive particles are thinly diffused, is used in the fourth embodiment, but any bonding method may be used, provided that electrical contact can be effected only between the desired electrodes while insulation is secured between other electrode wires.

As other bonding methods, there exists a method in which solder, Ag paste or the like is selectively placed only at regions whereat electrical contact is desired, as well as a method in which electrode metals are pressed to each other by applying a load to the substrate, and so forth. As the selective solder formation, there exists a so-called flip-chip packaging in which a solder ball is placed, and a method in which a film of solder is selectively formed by plating. As the selective formation of Ag paste, there exist a screen printing method and the like. In either method, selective formation is possible in a size of about 50-μm square.

Further, though the resin substrate 55 is used as the substrate to be bonded, it is naturally possible to connect a bare chip to another bare chip of the Si substrate on which the integrated circuit is formed as in the third embodiment, as illustrated in FIG. 12.

Fifth Embodiment

In the above embodiments, InP series and dielectric mirrors are used, but in a fifth embodiment, the concept of the present invention is applied to a VCSEL of GaAs series provided with epitaxial mirrors. When the GaAs substrate is used, high-reflection DBR mirrors can be formed at opposite end surfaces by epitaxially growing AlAs/GaAs (or AlGaAs) multi-layers together with the active layer. Therefore, no separate formation step of the dielectric mirror is needed, so that the overall process can be considerably simplified.

Figure 8:
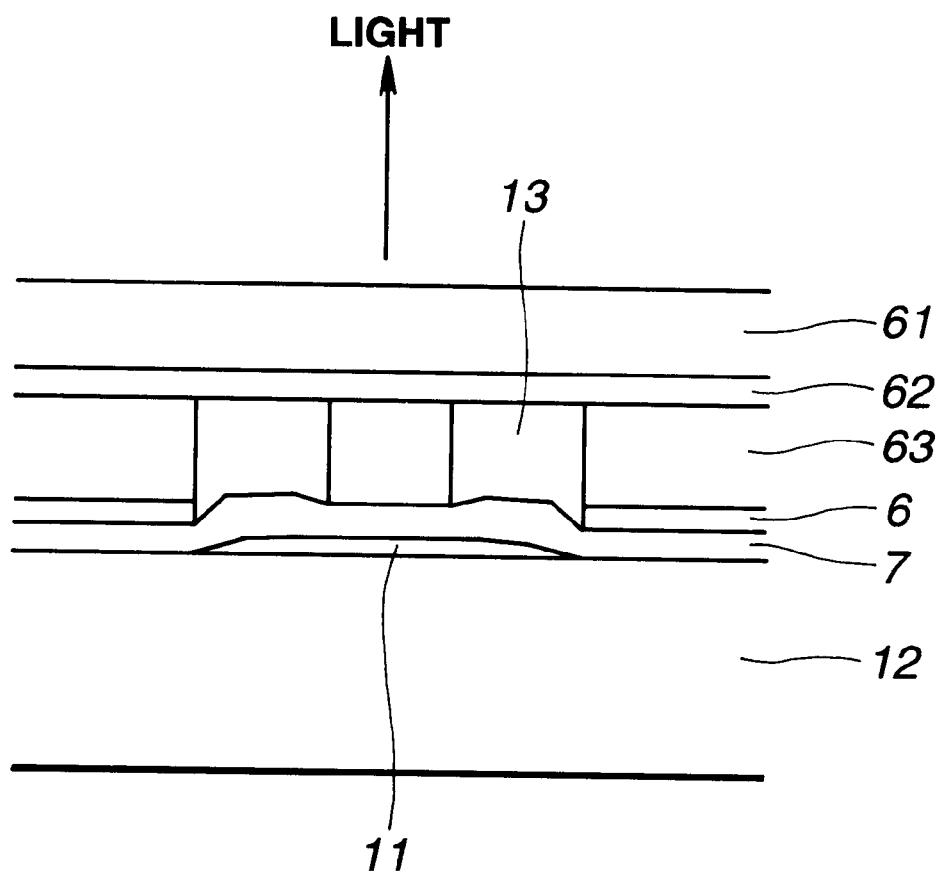
FIG. 8 is a cross-sectional view illustrating the structure of a single VCSEL with an epitaxial mirror of a fifth embodiment according to the present invention.

FIG. 8 illustrates such a structure. An n-AlAs/AlGaAs (twenty-five pairs) DBR mirror 61, a GaAs/AlGaAs multiple quantum well active layer 62 sandwiched between AlGaAs spacers, and a p-AlAs/AlGaAs (thirty pairs) DBR mirror 63 are formed on the n-GaAs substrate (not shown) during a single epitaxial growth process. The overall thickness of the active layer and the spacer layers is set to one wavelength of the oscillation wavelength. In this embodiment, the oscillation wavelength is 835 nm, and that overall thickness is about 250 nm. The uppermost layer of the p-DBR mirror 63 is made of GaAs such that the electrode contact to the mirror 63 can be improved. Also in this embodiment, the pixel is formed similarly to the first embodiment, but only the formation of the insulation structure of the SiN 6, the burying with the polyimide 13, and the formation of the p-electrode pattern 7 are needed since the two mirrors has already formed.

After this wafer is bonded to the Si substrate 12 or the like, the n-GaAs substrate is removed except a portion thereof, as in the above embodiments. Here, selective etching of the GaAs substrate and the first layer AlAs of the n-DBR mirror 61 is conducted using a wet etching of ammonia plus hydrogen peroxide series and dry etching, for example. The n-side electrode may be the same as that of the first embodiment.

There is no need to remove the n-GaAs substrate where light is taken from the side of the p-DBR mirror 63, but in such a case, precise and acurate patterning is required to form a window for taking out the light in the p-side electrode 7. Therefore, where the device is a GaAs-series device whose wavelength band (below about 850 nm) is absorbable by the growth substrate, the fifth embodiment is effective since no window is formed in the p-electrode 7 and the n-GaAs substrate is removed.

Sixth Embodiment

Figure 9:
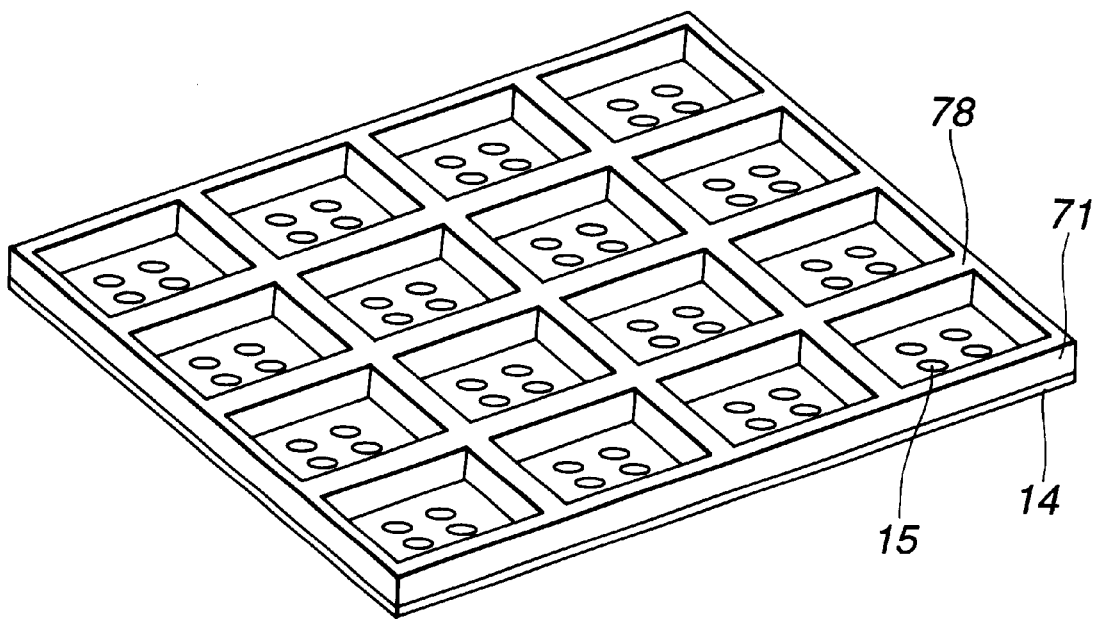
FIG. 9 is a perspective view illustrating the structure of a VCSEL array of a sixth embodiment according to the present invention.

In a sixth embodiment, layers grown on the growth substrate are not bonded to another substrate, and a multiplicity of regions with small areas, where active regions are highly densely arrayed, are arranged, as illustrated in FIG. 9. When the hole-etching region has a small area, say about 300-μm square (this value is roughly determined by the strength needed to maintain the laser substrate and a desired value of electric resistance on the side of an electrode 78), a lattice-shaped substrate 71 has a sufficient strength and hence no bonding to another substrate is needed. In this embodiment, four (2×2) pixels 15 are integrated at a pitch of 125 μm in the area of 300 μm², the lattice-shaped substrate has a width of 100 μm, and sixteen partitions each including four pixels are arranged in a two-dimensional pattern.

Where the integration degree is low (i.e., the pitch between pixels is relatively large), the structure of this embodiment formed by a simple process is effective since the lattice-shaped substrate 71 with the electrode 78 thereon can be left between the pixels 15.

Seventh Embodiment

Figure 10:
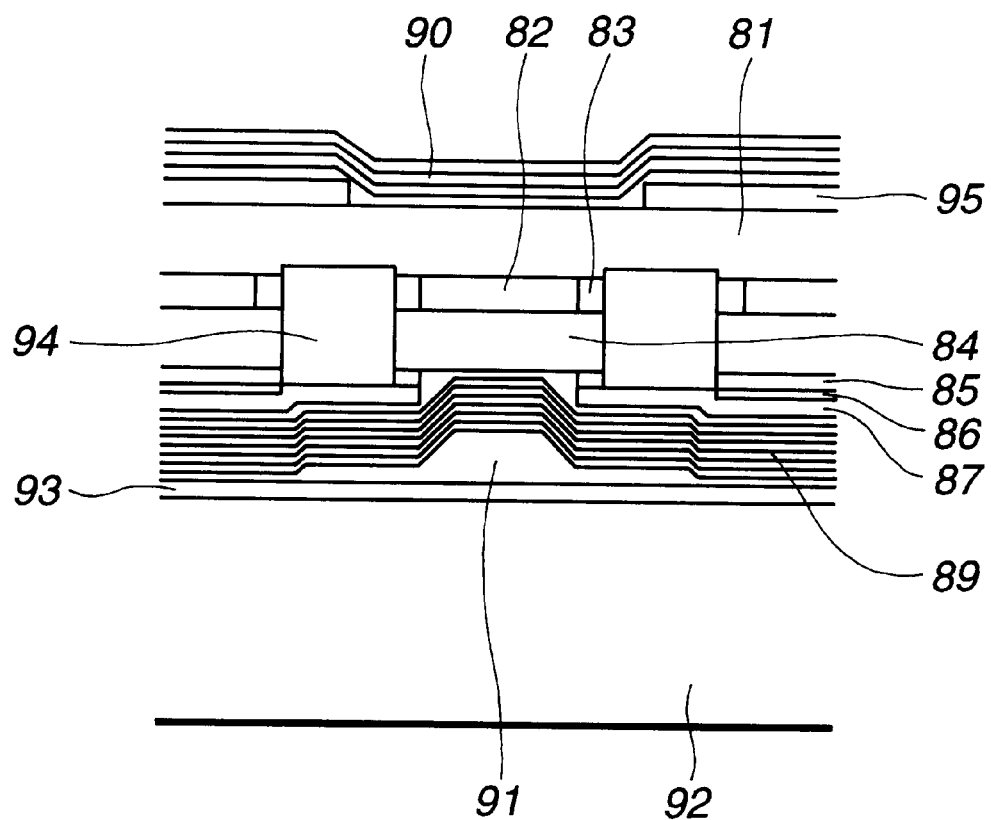
FIG. 10 is a cross-sectional view illustrating the structure of a display apparatus using a VCSEL array of a seventh embodiment according to the present invention.

In a seventh embodiment, lasers or LEDs of GaN-series material for emitting light from blue to ultraviolet (wavelength: 420 nm~380 nm) are bonded to another substrate to form the arrangement in a two-dimensional array, as described in the above embodiments. When a glass is used as that another substrate and fluorescent substance is applied to a glass substrate 92 for each pixel as illustrated in FIG. 10 such that fluorescent light of R, G or B can be emitted therefrom, the device can be used as a full-color display device by using optical stimulation by the light from blue to ultraviolet.

The pixels can be formed with the pixel diameter of 25 μm and the interval of about 75 μm, and the area of the arrayed pixels can be largely increased. Therefore, even a panel-type large-scale full-color display device can be built. Since a low-threshold laser is used as the light emitting source, display can be performed with small consumption electric power and large luminance, and no high voltage and no vacuum are needed.

The structure and process are similar to those of the above embodiments. Those will be described with reference to FIG. 10.

A low-temperature buffer layer (not shown) of GaN or A/N, which can be formd at low growth temperature, is formed with a relatively large thickness of about 10 μm on a sapphire substrate (not shown). A clad layer 81 of n-GaN/n-AlGaN, a multiple quantum well active layer 82 of undoped InGaN/AlGaN, a clad layer 84 of p-AlGaN/p-GaN, and a p-GaN cap layer 85 are then grown using a metal organized vapor phase epitaxy (MOVPE) method or the like. Similarly to the first embodiment, the pixel and the like are formed using etching, such as RIBE, and so forth. In this embodiment, selective constriction etching of the active layer 82 is difficult, so a current block region 83 is formed by selectively oxidizing the AlGaN layer (a barrier layer) in the active layer 82. This process uses the phenomenon that when heating process is performed at about 500° C. in the atmosphere of water vapor, an oxidized portion proceeds inwardly from a side wall of the layer containing easily-oxidizable Al. At this time, the side wall of AlGaN layer in the clad layer 84 is also oxidized similarly, but no current block region is formed thereat since the cap layer 85 remains unchanged due to its GaN. Therefore, no problem occurs.

Then, after the groove portion is buried with a burying layer 94, Ni (its thickness: 1000 Å)/Au (its thickness: 3000 Å) is deposited as a p-side electrode 87. Reference numeral 86 designates an insulating layer.

Thereafter, a dielectric multi-layer mirror 89 of eighteen pairs of $SiO_2$/MgO is formed using RF sputtering method or the like, and the thus-formed wafer is bonded to the glass substrate 92 on which RGB fluorescence substance 93 is patterned corresponding to each pixel, by adhesive 91.

The sapphire substrate is removed, except for its outer frame portion, by polishing or the like until the buffer layer appears. The exposed low-temperature buffer layer of GaN or A/N is removed by etching, using phosphoric acid heated up to 300° C. Here, the etching rate of the n-GaN layer in the clad layer 81 of epitaxially-grown single crystal n-GaN/n-AlGaN is very slow for the above etchant, and hence the selective etching can be effected.

A matrix-shaped wiring is formed similarly to the second embodiment. Specifically, a pattern of Ti (its thickness: 500

Å)/Al (its thickness: 1 μm)/Au (its thickness: 2000 Å) is formed as an n-side electrode 95, as illustrated in FIG. 5. The epitaxial layers may be removed in the lattice-shaped pattern 32 and polyimide or the like may be put therein, as illustrated in FIG. 5, so that the interference of the n-side electrode can be prevented. Finally, after the electrode 95 in the pixel is removed in a circular shape of 15-μm diameter, a dielectric multi-layer mirror 90 of SiO$_2$/MgO is laid down over all the array region (not on the outer frame portion of the growth substrate). The display can be thus performed by the matrix driving.

In the case of the LED, no dielectric mirror 89 is formed on the side of the fluorescent substrate 93. Also in the first to sixth embodiments, the LED array can be formed without forming the mirror on the light-takeout side. Thus the LED can be fabricated readily.

In the above embodiments, light emission devices are arranged, but the light emission device can be replaced by a light receiving device. Where the electric wire and so forth are formed on the bonding substrate and light need be input from the side of the growth substrate not of the bonding substrate, the array of the light receiving devices can be relatively readily formed when the growth substarte is removed as illustrated in FIG. 3A. The structure in this case may be approximately the same as that of FIGS. 3A and 3B, except that the active layer is an absorptive layer and an inverse electric field is applied across the electrodes to take a photo-current therefrom. When the device is constructed as light receiving device, no multi-layer mirrors is basically needed, but its light reception efficiency can be improved if the mirror on the side of the bonding substrate is formed, similarly to the laser, to reflect light thereat and return it to the light absorptive layer.

As described in the foregoing, according to the present invention, a surface-type optical device capable of being readily fabricated with good productivity and suitable for a two-dimensional array light emission apparatus can be achieved. Its preferable fabrication method, display apparatus using that device and the like can also be obtained.

Except as otherwise disclosed herein, the various components shown in outline or block form in any of FIGS. 1–11 are individually well known in the optical semiconductor device, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A surface-type optical device comprising:
   a first substrate;
   a plurality of active regions formed and disposed on said first substrate, a portion of said first substrate being removed over an area including at least two said active regions; and
   control means for injecting a current into or applying an inverse voltage to each of said active regions, light being output from or input into each of said active regions perpendicularly to said first substrate.

2. A surface-type optical device according to claim 1, said active regions being arrayed, and a portion of said first substrate being removed over an area of all of said arrayed active regions.

3. A surface-type optical device according to claim 2, a portion of said first substrate being left outside all of said arrayed active regions.

4. A surface-type optical device according to claim 1, said active regions being arrayed, and a portion of said first substrate being left in a lattice-shaped form over an area of all of said arrayed active regions.

5. A surface-type optical device according to claim 1, further comprising a second substrate, said first substrate having said active regions arrayed thereon and being bonded to said second substrate with said active regions interposed between said first substrate and said second substrate.

6. A surface-type optical device according to claim 1, said control means including a common electrode common to said active regions formed on a remaining portion of said first substrate.

7. A surface-type optical device according to claim 1, said control means including an electrode pattern formed in said area including at least two active regions which extends each electrode from each of said active regions.

8. A surface-type optical device according to claim 1, further comprising a second substrate, said first substrate with said active regions arrayed thereon being bonded to said second substrate with said active regions interposed between said first substrate and said second substrate, and said control means including an electrode pattern formed on a surface of said active regions, to which said second substrate is bonded, said electrode pattern being exposed by a removal of an outermost portion of said first substrate and a portion of said active regions which extends each electrode from each of said active regions.

9. A surface-type optical device according to claim 1, further comprising a second substrate, said first substrate with said active regions arrayed thereon being bonded to said second substrate with said active regions interposed between said first substrate and said second substrate, and said control means including an electrode pattern formed on a surface of said second substrate, to which said first substrate is bonded such that the electrode pattern is electrically connected to each of said active regions which extends each electrode from each of said active regions.

10. A surface-type optical device according to claim 1, said control means comprising positive and negative electrodes formed in a matrix form such that each of said active regions can be driven independently.

11. A surface-type optical device according to claim 1, further comprising a second substrate, said first substrate with said active regions arrayed thereon being bonded to said second substrate with said active regions interposed between said first substrate and said second substrate, and said second substrate comprising a semiconductor substrate with an electronic circuit formed thereon, at least one electrode of said electronic circuit being electrically connected to each of said active regions through an electric wire formed on said second substrate.

12. A surface-type optical device according to claim 1, said active region comprising a light emission layer such that a surface emitting device for emitting light perpendicularly to said first substrate is formed.

13. A surface-type optical device according to claim 12, said surface emitting device comprising a vertical cavity surface emitting laser with a pair of reflection mirrors provided on opposite sides of said light emission layer.

14. A surface-type optical device according to claim 12, said surface emitting device comprising a light emitting device with at most a reflection mirror provided on one side of said light emission layer.

15. A surface-type optical device according to claim 1, said active region comprising a light absorptive layer such that a surface-type light receiving device for receiving light input perpendicularly to said first substrate is formed.

16. A surface-type optical device according to claim 15, said surface-type light receiving device comprising a light receiving device with at least a reflection mirror provided on at least a side of said light absorption layer.

17. A surface-type optical device according to claim 1, said active region comprising at least a reflection mirror consisting of two kinds of dielectric layers which are alternately layered.

18. A surface-type optical device according to claim 1, said active region comprising at least a reflection mirror consisting of two kinds of semiconductor layers which are alternately layered.

19. A surface-type optical device according to claim 1, further comprising a second substrate of a transparent material, said first substrate having said active regions arrayed thereon and being bonded to said second substrate with said active regions interposed between said first substrate and said second substrate, each of said active regions comprising a light emission layer such that a surface emitting device for emitting light perpendicularly to said first substrate is formed, and further comprising a fluorescent substance provided between said surface emitting device and said second substrate such that display can be performed by light of a color at an emission wavelength of said surface emitting device or light of a fluorescence color generated when said fluorescent substance is stimulated by the light from said surface emitting device.

20. A surface-type optical device according to claim 1, said active regions comprising layers of compound semiconductor consisting of a III-group element selected from the group consisting of B, Al, Ga and In and N.

21. A surface-type optical device according to claim 1, said active regions comprising an active layer of an oxide of Zn and clad layers of an oxide of Mg.

22. A surface-type optical device according to claim 1, said active regions including a current constriction structure for constricting a current flow.

23. A fabrication method of a surface-type optical device, comprising the steps of:

epitaxially growing layers including an active layer on a first substrate;

forming a plurality of active regions on the first substrate, each active region being constructed such that light is output from or input into each active region perpendicularly to the first substrate; and removing a portion of the first substrate over an area including at least two of the active regions.

24. A fabrication method according to claim 23, further comprising the step of bonding a side of the epitaxially-grown layers of the first substrate to a second substrate.

25. A fabrication method according to claim 23, further comprising the step of forming a current constriction structure for constricting a current flow to the active layer in the active region.

26. A fabrication method according to claim 23, further comprising the step of forming a reflection mirror on a side of the epitaxially-grown layers of the first substrate.

27. A fabrication method according to claim 23, further comprising the step of forming a reflection mirror on a face of the epitaxially-grown layers exposed by said removing step.

28. A fabrication method according to claim 23, said removing step being performed after said forming step of the active regions.

29. A fabrication method according to claim 23, said forming step of the active regions being performed after said removing step.

30. A fabrication method according to claim 24, said removing step being performed after said bonding step.

* * * * *

UNITED STATES PATENT AND TRADEMARK OFFICE
CERTIFICATE OF CORRECTION

PATENT NO. : 6,222,868 B1
DATED : April 24, 2001
INVENTOR(S) : Toshihiko Ouchi et al.

It is certified that error appears in the above-identified patent and that said Letters Patent is hereby corrected as shown below:

<u>Column 1,</u>
Line 26, "using" should read -- using a --.

<u>Column 2,</u>
Line 10, "using" should read -- using a --;
Line 26, "as" should read -- as the --;
Line 51, "arrayal" should read -- array --; and
Line 58, "arrayal" should read -- array --.

<u>Column 3,</u>
Line 56, "(typically," should read -- (typically, an --.

<u>Column 5,</u>
Line 11, "includess" should read -- includes --; and
Line 48, "A" should read -- The --.

<u>Column 6,</u>
Line 46, "is" should read -- are --.

<u>Column 9,</u>
Line 63, "on" should read -- on the --.

<u>Column 10,</u>
Line 56, "Heat" should read -- The heat --.

<u>Column 13,</u>
Line 35, "has" should read -- have --.

UNITED STATES PATENT AND TRADEMARK OFFICE
CERTIFICATE OF CORRECTION

PATENT NO.     : 6,222,868 B1
DATED          : April 24, 2001
INVENTOR(S)    : Toshihiko Ouchi et al.

It is certified that error appears in the above-identified patent and that said Letters Patent is hereby corrected as shown below:

Column 14,
Line 29, "formd" should read -- formed --; and
Line 61, "A/N" should read -- AlN --.

Column 15,
Line 22, "substarte" should read -- substrate --; and
Line 27, "is" should read -- are --.

Column 16,
Line 65, "absorptive" should read -- absorption --.

Signed and Sealed this

Twenty-sixth Day of March, 2002

Attest:

JAMES E. ROGAN
*Attesting Officer*                    *Director of the United States Patent and Trademark Office*